(12) United States Patent
Zhang et al.

(10) Patent No.: US 11,329,144 B2
(45) Date of Patent: May 10, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Shiliang Ji, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 158 days.

(21) Appl. No.: 16/711,548

(22) Filed: Dec. 12, 2019

(65) Prior Publication Data
US 2020/0235228 A1 Jul. 23, 2020

(30) Foreign Application Priority Data
Jan. 21, 2019 (CN) .......................... 201910053550.2

(51) Int. Cl.
*H01L 29/66* (2006.01)
*H01L 21/8234* (2006.01)
(Continued)

(52) U.S. Cl.
CPC .... *H01L 29/66818* (2013.01); *H01L 21/3065* (2013.01); *H01L 21/3083* (2013.01);
(Continued)

(58) Field of Classification Search
CPC .......... H01L 29/66818; H01L 29/0673; H01L 29/66545; H01L 29/6681; H01L 29/7853;
(Continued)

(56) References Cited

U.S. PATENT DOCUMENTS

2018/0350800 A1* 12/2018 Chang .................... H01L 29/517
2020/0006577 A1*  1/2020 Ching ............... H01L 29/42392
(Continued)

OTHER PUBLICATIONS

Ha et al., Highly Manufacturable 7nm FinFET Technology Featuring EUV Lithography for Low Power and High Performance Applications. 2017 Symposium on VLSI Technology, Jun. 5-8, 2017. 2 pages. Kyoto, Japan.

*Primary Examiner* — Christine A Enad
(74) *Attorney, Agent, or Firm* — Anova Law Group, PLLC

(57) ABSTRACT

Semiconductor structures and fabrication methods are provided. An exemplary fabrication method includes providing a semiconductor substrate having a first region; forming a plurality of first initial fin structures on the first region of the semiconductor substrate; forming a dummy gate structure across the first initial fin structures by covering portions of top and sidewall surfaces of the first initial fin structures; forming a dielectric layer covering sidewall surfaces of the dummy gate structure and exposing a top surface of the dummy gate structure; removing the dummy gate structure to form a first opening in the dielectric layer and expose portions of top and sidewall surfaces of the first initial fin structures; and performing at least one trimming process on the first initial fin structures to form fin first structures. A width of each first fin structure is smaller than a width of each first initial fin structure.

20 Claims, 6 Drawing Sheets

(51) Int. Cl.
    *H01L 21/3065*     (2006.01)
    *H01L 21/308*     (2006.01)
    *H01L 27/088*     (2006.01)
    *H01L 29/06*     (2006.01)
    *H01L 29/78*     (2006.01)

(52) U.S. Cl.
    CPC .............. *H01L 21/823412* (2013.01); *H01L 21/823431* (2013.01); *H01L 27/0886* (2013.01); *H01L 29/0673* (2013.01); *H01L 29/6681* (2013.01); *H01L 29/66545* (2013.01); *H01L 29/7853* (2013.01)

(58) Field of Classification Search
    CPC ......... H01L 21/3065; H01L 21/823412; H01L 21/823431
    See application file for complete search history.

(56) References Cited

U.S. PATENT DOCUMENTS

| | | | |
|---|---|---|---|
| 2020/0105617 A1* | 4/2020 | Wang | ............... H01L 29/0673 |
| 2020/0127124 A1* | 4/2020 | Ching | ............... H01L 29/66545 |
| 2020/0144124 A1* | 5/2020 | Bi | ............... H01L 21/823456 |
| 2021/0098459 A1* | 4/2021 | Chiang | ............... H01L 27/0924 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201910053550.2, filed on Jan. 21, 2019, the entirety of which is incorporated herein by reference.

FIELD OF THE DISCLOSURE

The present disclosure generally relates to the field of semiconductor technology and, more particularly, relates to semiconductor structures and fabrication methods.

BACKGROUND

With the rapid development of integrated circuit (IC) manufacturing technologies, the sizes of the semiconductor devices in the integrated circuits (ICs) are continuously reduced such that the operating speeds of the entire ICs can be effectively improved. However, when the sizes of the devices are further reduced, the control capability of the conventional planar MOS transistor on the channel current is weakened, and the short channel effect (SCE) is becoming more and more severe. FinFETs (Fin FETs) are emerging multi-gate devices with an excellent gate-to-channel control ability and widely used in the devices with smaller critical sizes (CDs).

Currently, the drain induced barrier lowering (DIBL) effect of an FinFET can be suppressed by forming fins with two different critical dimensions (CDs). However, there is a need to further improve the performance of the semiconductor structure having fins with different widths. The disclosed methods and semiconductor structures are directed to solve one or more problems set forth above and other problems in the art.

BRIEF SUMMARY OF THE DISCLOSURE

One aspect of the present disclosure includes a method for forming a semiconductor structure. The method may include providing a semiconductor substrate having a first region; forming a plurality of first initial fin structures on the first region of the semiconductor substrate; forming a dummy gate structure across the plurality of first initial fin structures by covering portions of top and sidewall surfaces of the plurality of first initial fin structures; forming a dielectric layer covering sidewall surfaces of the dummy gate structure and exposing a top surface of the dummy gate structure on the semiconductor substrate; removing the dummy gate structure to form a first opening in the dielectric layer and expose portions of top and sidewall surfaces of the plurality of first initial fin structures; and performing at least one trimming process on portions of the plurality of first initial fin structures to form a plurality of fin first structures. A width of each of the plurality of first fin structures is smaller than a width of each of the plurality of first initial fin structures.

Another aspect of the present disclosure includes a semiconductor structure. The semiconductor structure may include a semiconductor substrate having a first region; a plurality of first fin structures formed on the first region of the semiconductor substrate; and a dielectric layer having a first opening formed on the semiconductor substrate. The first opening may expose top and sidewall surfaces of the plurality first fin structures in the first region. The plurality of first fin structures are formed by forming a plurality of first initial fin structures on the first region of the semiconductor substrate; forming a dummy gate structure across the plurality of first initial fin structures by covering portions of top and sidewall surfaces of the plurality of first initial fin structures; forming the dielectric layer covering sidewall surfaces of the dummy gate structure and exposing a top surface of the dummy gate structure on the semiconductor substrate; removing the dummy gate structure to form the first opening in the dielectric layer and expose portions of top and sidewall surfaces of the plurality of first initial fin structures; and performing at least one trimming process on portions of the plurality of first initial fin structures to form the plurality of fin first structures. A width of each of the plurality of first fin structures is smaller than a width of each of the plurality of first initial fin structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
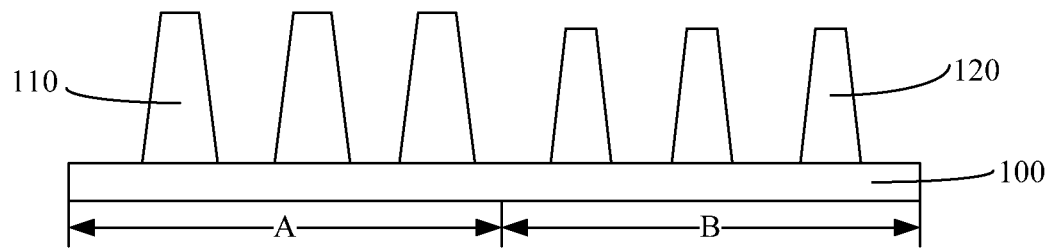
FIG. 1 illustrates a semiconductor structure.

FIG. 1 illustrates a semiconductor structure. As shown in FIG. 1, the semiconductor structure includes a semiconductor substrate 100. The semiconductor substrate 100 may include a first region A and a second region B; and the second region B may be adjacent to the first region A. The semiconductor structure may also include a plurality of first fins 110 formed on the first region A of the semiconductor substrate 100 and a plurality of discrete second fins 120 formed on the second region B of the semiconductor substrate 100.

A size of a second fin 120 along a direction perpendicular to the extending direction (i.e., the length direction) of the second fin 120 is smaller than a size of a first fin 110 along a direction perpendicular to the extending direction of the first fin 110. Further, the size of the second fin 120 along the direction parallel to the normal direction of the surface of the semiconductor substrate 100 is smaller than the size of the first fin 110 along a direction parallel to the normal direction of the surface of the semiconductor substrate 100. The first fins 110 and the second fins 120 of the semiconductor structure have different widths. The first fins 110 and the second fins 120 of different sizes can meet different performance requirements; and the semiconductor structure may have a desired performance.

However, because the width and thickness of the first fins 120 in the first region A are both small, a deformation and even cracks are more likely to occur. Thus, it is desirable to improve the performance of the semiconductor structure.

As used herein, the width of the first fin 110 refers to a dimension of the first fin 110 along the direction perpendicular to the extending (length) direction of the first fin 110; and the thickness of the first fin 110 refers to a dimension of the first fin 110 along the direction parallel to the normal direction of the surface of the semiconductor substrate 100.

The present disclosure provides a semiconductor structure and a method for forming a semiconductor structure. The method may include performing at least one trimming process on the first initial fin structures exposed by the first opening to form a plurality of first fin structures. The width of the first fin structure may be smaller than the width of the first initial fin structure. The semiconductor structure formed by the disclosed method may have a desired performance.

Figure 16:
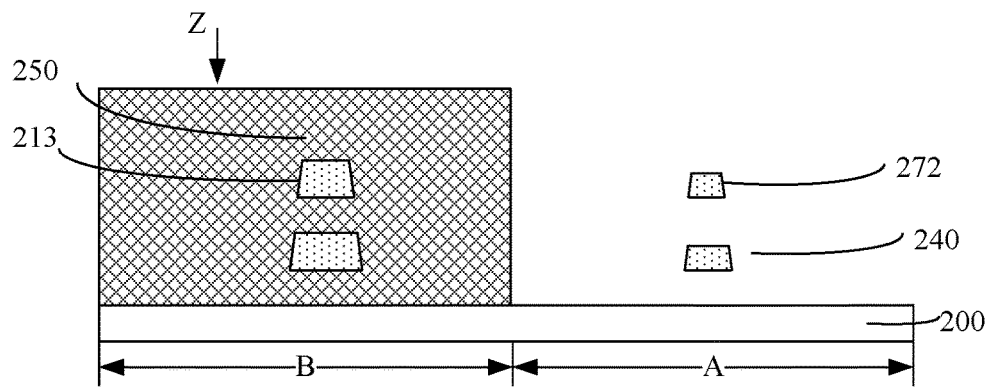
Figure 17:
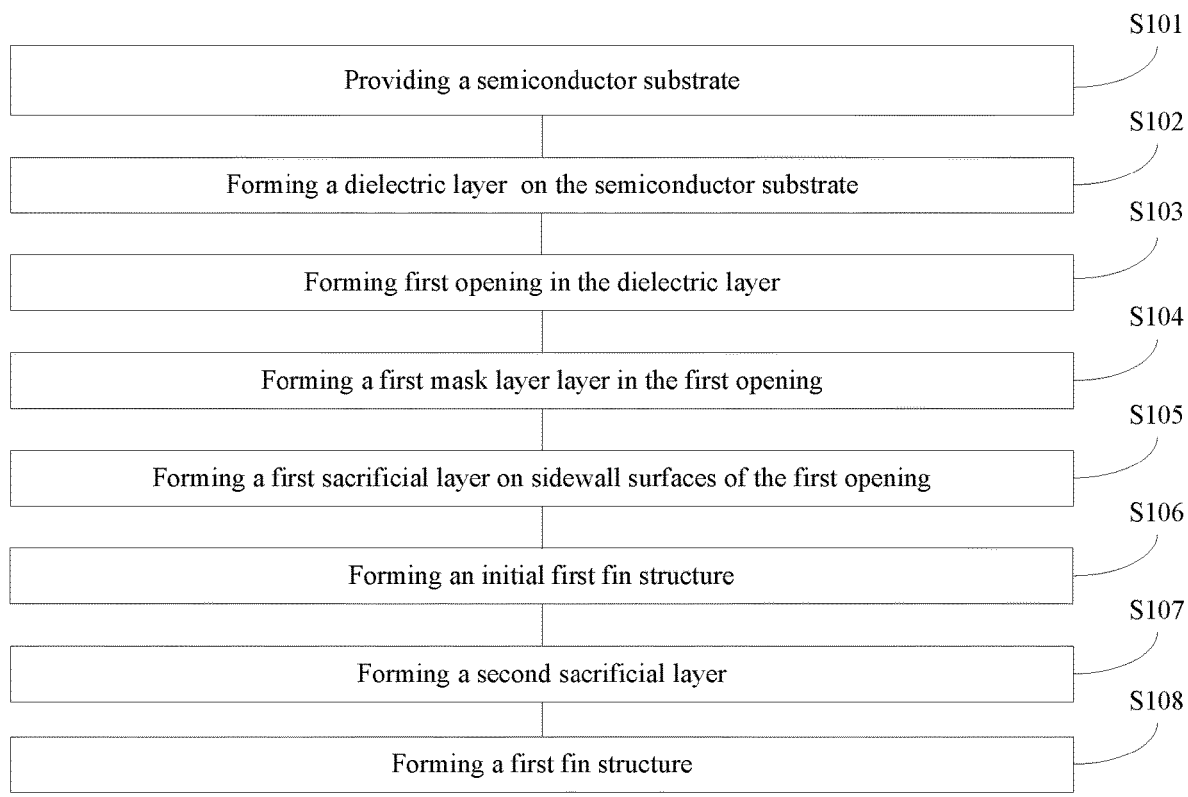
FIG. 17 illustrates an exemplary fabrication process of a semiconductor structure consistent with various disclosed embodiments of the present disclosure.

FIG. 17 illustrates an exemplary fabrication process of a semiconductor structure consistent with various disclosed embodiments of the present disclosure. FIGS. 2-16 illustrate structures corresponding to certain stages during the exemplary fabrication process consistent with various disclosed embodiments of the present disclosure.

Figure 2:
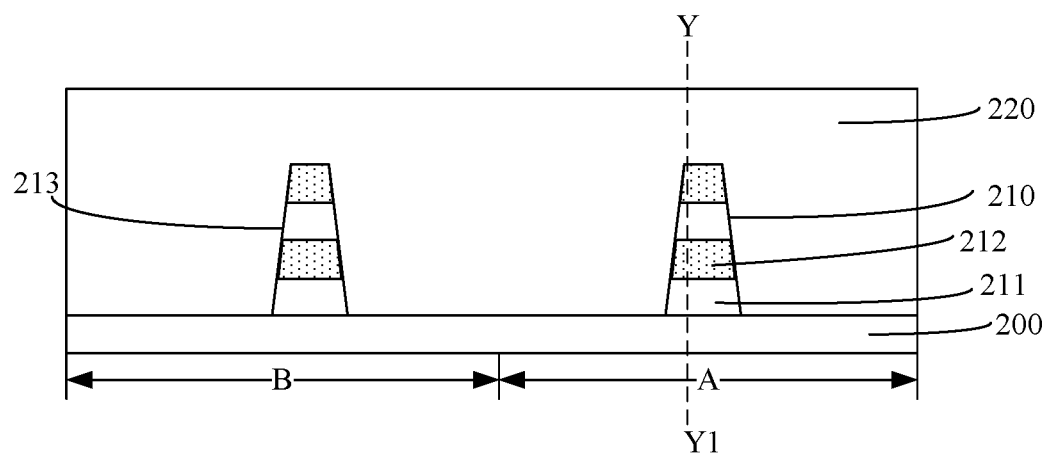
FIGS. 2-16 illustrate structures corresponding to certain stages during an exemplary fabrication process of a semiconductor structure consistent with various disclosed embodiments of the present disclosure.
Figure 3:
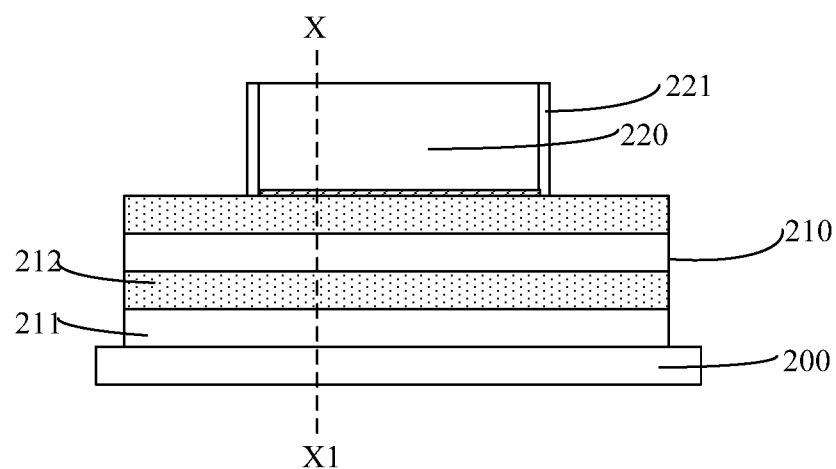

As shown in FIG. 17, at the beginning of the fabrication process, a semiconductor substrate with certain structures is provided (S101). FIGS. 2-3 illustrate a corresponding structure. FIG. 2 is an X-X1-sectional view of the structure in FIG. 3; and FIG. 3 is a Y-Y1-sectional view of the structure in FIG. 2.

As shown in FIGS. 2-3, a semiconductor substrate 200 is provided. The semiconductor substrate 200 may have a first region A and a second region B adjacent to the first region A. A plurality of first initial fin structures 210 may be formed on the surface of the first region A of the semiconductor substrate 200. Further, a dummy gate structure 220 may be formed on the surface of the first region A of the semiconductor substrate 200. The dummy gate structure 220 may cover portions of the top surfaces and the sidewall surfaces of the plurality of first initial fin structures 210.

In one embodiment, for illustrative purposes, one of the plurality of first initial fin structures 210 is illustrated on the surface of the first region A of the semiconductor substrate 200 and described.

In one embodiment, the semiconductor substrate 200 is made of silicon. The relatively low cost of silicon may reduce the manufacturing cost of semiconductor devices. In some embodiments, the semiconductor substrate may be made of germanium, or silicon germanium, etc.

In one embodiment, a first initial fin structure 210 may include a plurality of layers of composite initial fin layers stacked along a normal direction of the surface of the semiconductor substrate 200. The composite initial fin layers may include a first initial fin layer 211 and a second initial fin layer 212 on the surface of the first initial fin layer 211. The first initial fin layer 211 and the second initial fin layer 212 may be made of different materials.

The first initial fin layer 211 and the second initial fin layer 212 may be made of different materials, and the first initial fin layer 211 and the second initial fin layer 212 may have different etching selectivity ratios. Thus, when the first initial fin layer 211 is subsequently removed, the damage to the second initial fin layer 212 may be reduced.

In one embodiment, the semiconductor substrate 200 and the second initial fin layer 211 are made of silicon; and the first initial fin layer 212 may be made of silicon germanium. In some embodiments, the first initial fin layer may be made of silicon carbide; and the second initial fin layer may be made of a group III-V element semiconductor, InGaAs, or germanium, etc.

In one embodiment, the dummy gate structure 220 may include a dummy gate dielectric layer (not shown) covering a top surface and sidewall surfaces of the first initial fin structure 210 and a dummy gate layer formed on the surface of the dummy gate dielectric layer, and a sidewall structure 221 formed on the sidewall surfaces of the dummy gate dielectric layer and the dummy gate layer.

The sidewall structure 221 may be made of any appropriate material, such as silicon oxide, silicon nitride, silicon carbonitride, silicon carbide, aluminum oxide, hafnium oxide, silicon oxynitride or silicon oxycarbide, etc. In one embodiment, the sidewall structure 221 is made of silicon nitride.

In one embodiment, the semiconductor substrate 200 may also include the second region B adjacent to the first region A. A plurality of second fin structures 213 may be formed on the surface of the second region B of the semiconductor substrate 200. The dummy gate structure 220 may also extend onto the second region B of the semiconductor substrate 200 and may be across the second fin structures 213 by covering portions of the top and sidewall surfaces of the second fin structures 213.

In one embodiment, for illustrative purposes, one of the plurality of second fin structures 213 is shown on the surface of the second region B of the semiconductor substrate 200; and described.

In one embodiment, the type of the semiconductor device formed in the second region B is different from the type of the semiconductor device formed in the first region A. The second region B may be used to form a PMOS transistor; and the second region B of the semiconductor substrate 200 may be doped with N-type ions, such as arsenic ions, or phosphorus ions, etc. The first region A may be used to form an NMOS transistor; and the first region A of the semiconductor substrate 200 may be doped with P-type ions, such as boron ions, or $BF^{2-}$ ions, etc.

In some embodiments, the type of the semiconductor device formed in the first region may be the same as the type of the semiconductor device formed in the second region.

Figure 4:
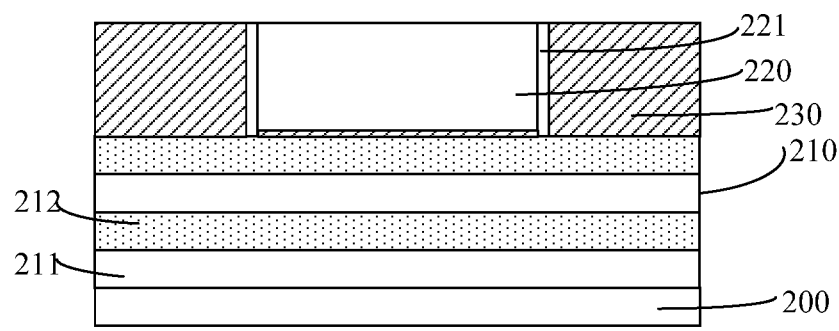

Returning to FIG. 17, after providing the semiconductor substrate with the certain structures, a dielectric layer may be formed (S102). FIG. 4 illustrates a corresponding semiconductor structure.

As shown in FIG. 4, a dielectric layer 230 may be formed on the surface of the semiconductor substrate 200. The dielectric layer 230 may cover the top and sidewall surfaces of the first initial fin structure 210, and the sidewall surfaces of the dummy gate structure 220. Further, the dielectric layer 230 may expose the top surface of the dummy gate structure 220.

The dielectric layer 230 may also be formed on the second region B of the semiconductor substrate 200. The dielectric layer 230 may be formed on the sidewall surfaces of dummy gate structure 220 in the second region B; and may expose the top surface of the dummy gate structure 220 in the second region B.

In one embodiment, the dielectric layer 230 may cover the sidewall surfaces of the sidewall structures 221 at both sides of the dummy gate structure 220 in the first region A and the second region B. Further, the dielectric layer 230 may expose the top surface of the dummy gate structure 220 in the first region A and the second region B and the top surface of the sidewall structure 221.

The method for forming the dielectric layer 230 may include forming a dielectric film (not shown) on the surface of the semiconductor substrate 200 and to cover the top and the sidewall surfaces of the first initial fin structure 210 and the sidewall surfaces of the dummy gate structure 220. The top surface of the dielectric film may be higher than the top surface of the dummy gate structure 220. Then, the dielectric film may be planarized until the top surface of the dummy gate structure 220 is exposed to form the dielectric layer 230.

Various processes may be used to form the dielectric film, such as a chemical vapor deposition (CVD) process, or a physical vapor deposition (PVD) process, etc.

The dielectric layer 230 may be made of any appropriate material, such as silicon oxide, silicon nitride, silicon carbonitride, silicon carbide, aluminum oxide, hafnium oxide, silicon oxynitride, or silicon oxycarbide, etc. In one embodiment, the dielectric layer 230 is made of silicon nitride.

Figure 5:
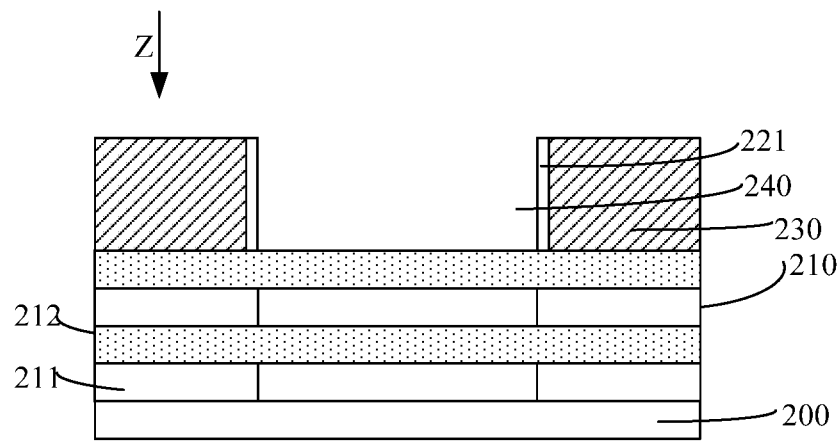
Figure 6:
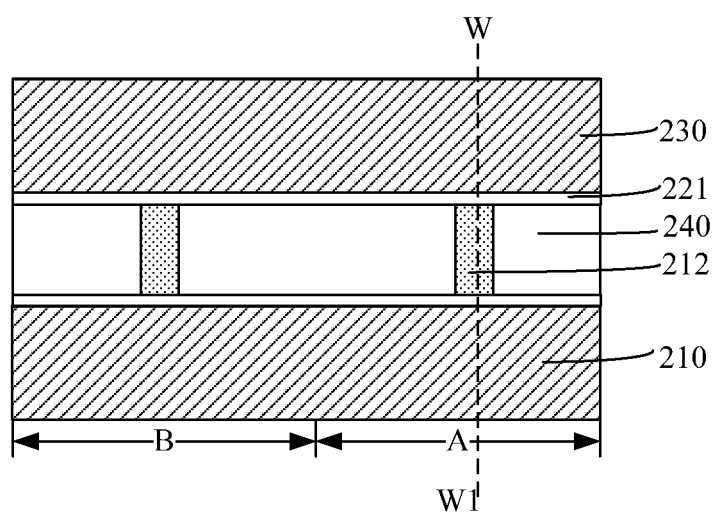

Returning to FIG. 17, after forming the dielectric layer, a first opening may be formed (S103). FIGS. 5-6 illustrate a corresponding semiconductor. FIG. 6 is a top view of the structure in FIG. 5 along the Z direction; and FIG. 5 is a W-W1-sectional view of the structure in FIG. 6. The views of FIG. 5 and FIG. 4 are in a same direction.

As shown in FIGS. 5-6, the dummy gate structure 220 may be removed, and a first opening 240 may be formed in the dielectric layer 230. The first opening 240 may expose portions of the top surface and sidewall surfaces of the first initial fin structure 210 in the first region A.

In one embodiment, the first opening 240 may also expose portions of the top and sidewall surfaces of the second fin structure 213 in the second region B.

In one embodiment, the method for forming the first opening 240 may include removing the dummy gate structure 220 to form an initial first opening (not shown) in the dielectric layer 240; removing the portion of the first initial fin layer 211 exposed by the sidewall surfaces of the initial first opening to form the first opening 240. The first opening 240 may expose the suspended second initial fin layer 212.

The process for removing the dummy gate structure 220 may include one or a combination of a wet etching process and a dry etching process, etc. The process for removing the first initial fin layer 211 exposed by the sidewall surfaces of the initial first opening may include one or a combination of a wet etching process and a dry etching process.

In one embodiment, removing the dummy gate structure 220 may only remove the dummy gate dielectric layer formed on portions of the top surfaces and the sidewall surfaces of the first initial fin structure 210 and the second fin structure 213 and the dummy gate layer formed on the dummy gate dielectric layer. The first opening 250 may expose the sidewall surfaces of the sidewall structure 221.

Figure 7:
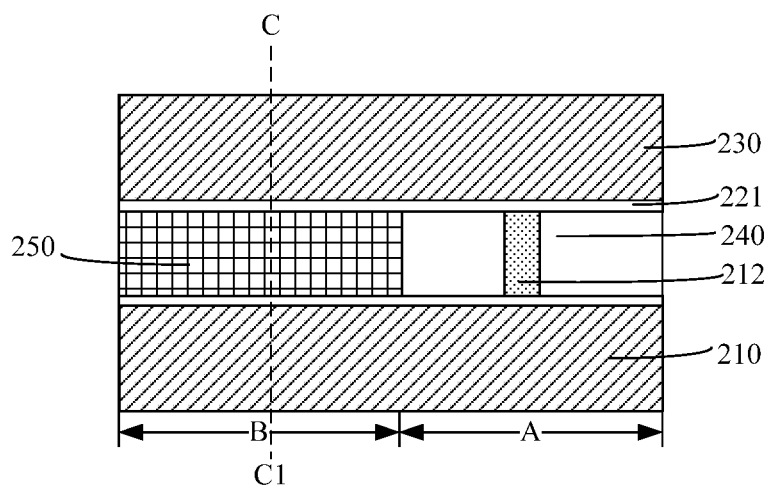
Figure 8:
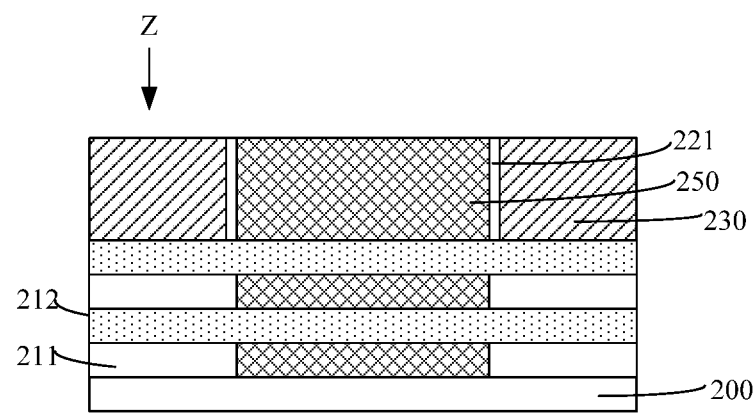

Returning to FIG. 17, after forming the first opening, a first mask layer may be formed (S104). FIGS. 7-8 illustrate a corresponding structure. FIG. 7 is a top view the structure in FIG. 8 along the Z direction; and FIG. 8 is a C-C1-sectional view of the structure in FIG. 7.

As shown in FIGS. 7-8, after forming the first opening 240, a first mask layer 250 may be formed in the first opening 240 in the second region B. The first mask layer 250 may cover the top and sidewall surfaces of the second fin structure 213 in the second region B.

The method for forming the first mask layer 250 may include filling the first opening 240 with a first mask material to form a first mask material layer (not shown). The top surface of the first mask material layer may level with the top surface of the dielectric layer 230. Then, a patterned layer (not shown) may be formed on the surface of the first mask material layer. The patterned layer may expose the surface of the first mask material layer in the first region A. Then, the first mask material layer may be etched using the patterned layer as an etching mask until the surface of the first region A of the semiconductor substrate 200 is exposed. Thus, the first mask layer 250 may be formed in the first opening 240 in the second region B.

The first mask material layer may be made of an organic material. Accordingly, the first mask layer 250 may be made of the organic material.

Various processes may be used to form the first mask material layer. In one embodiment, the first mask material layer is formed by a spin-coating process.

The first mask material layer may be etched by any appropriate process, such as one or more of a wet etching process, a dry etching process, and an ashing process, etc.

After forming the first mask layer, at least one trimming process may be performed on the first initial fin structure in the first opening in the first region to form a first fin structure. The width of the first fin structure may be smaller than the width of the first initial fin structure.

The step of the trimming process may include forming a sacrificial layer on the sidewall surfaces of the first opening in the first region. The sacrificial layer may cover portions of the top and sidewall surfaces of the first initial fin structure in the first opening in the first region. Then, portions of the top surface and sidewall surfaces of the first initial fin structure in the first opening in the first region may be etched by using the sacrificial layer and the dielectric layer as a mask to form the first fin structure.

Because the portion of the first fin structure exposed by the first opening may be formed by the trimming process, the width of the portion of the first fin structure exposed by the first opening may be smaller than the width of the portion of the first fin structure not exposed by the first opening. Further, the portion of the first fin structure exposed by the first opening may be connected to the portion of the first fin structure not exposed by the first opening. Thus, the portion of the first fin structure not exposed by the first opening may support the portion of the first fin structure exposed by the first opening. Accordingly, the deformation of the first fin structure may be reduced, and the possibility of breakage of the first fin structure may be reduced. Thus, the performance of the semiconductor structure may be as desired.

In one embodiment, the step of each trimming process may include forming a sacrificial layer on the sidewall surfaces of the first opening in the first region. The sacrificial layer may cover the top surfaces of the two ends of the first initial fin structure in the first opening in the first region. Thus, portions of the top surface and the sidewall surfaces of the first initial fin structure in the first opening in the first region may be etched by using the first mask layer, the sacrificial layer and the dielectric layer as a mask to form the first fin structure.

In one embodiment, two trimming processes may be used to form the first fin structure. The two trimming processes may include a first trimming process and a second trimming process after the first trimming process.

The first trimming process may include forming a first sacrificial layer on the sidewall surfaces of the first opening in the first region; and etching portions of the top and sidewall surfaces of the first initial fin structure within the first opening in the second region using the first mask layer, the first sacrificial layer, and the dielectric layer as a mask to form an initial first fin structure. The second trimming process may include forming a second sacrificial layer on the sidewall surfaces of the first sacrificial layer in the first opening in the first region; and etching portions of the top and sidewall surfaces of the initial first fin structure in the first opening in the first region using the first mask layer, the first sacrificial layer, the second sacrificial layer as a mask to form the first fin structure.

The process for forming the first fin structure will be described in detail with reference to FIGS. 9-16. FIGS. 9-12 are corresponding to the structures during the first trimming process, and FIGS. 13-16 are corresponding to the structures during the second trimming process.

Figure 9:
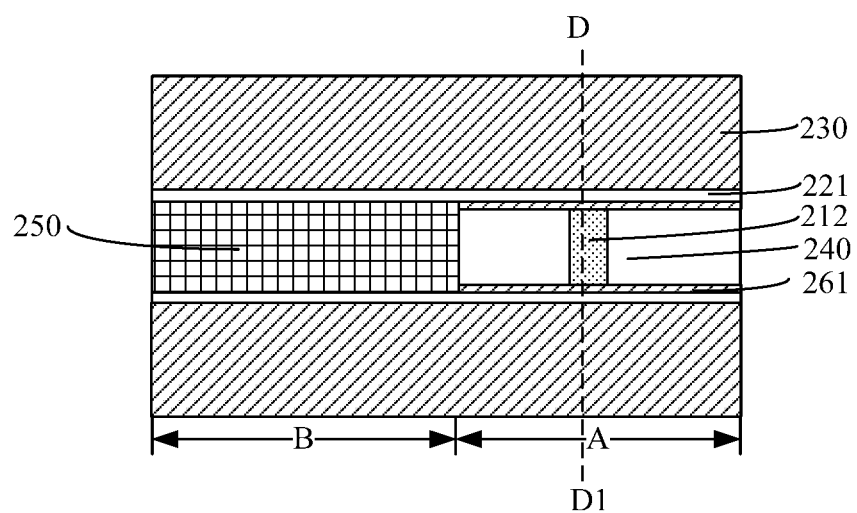
Figure 10:
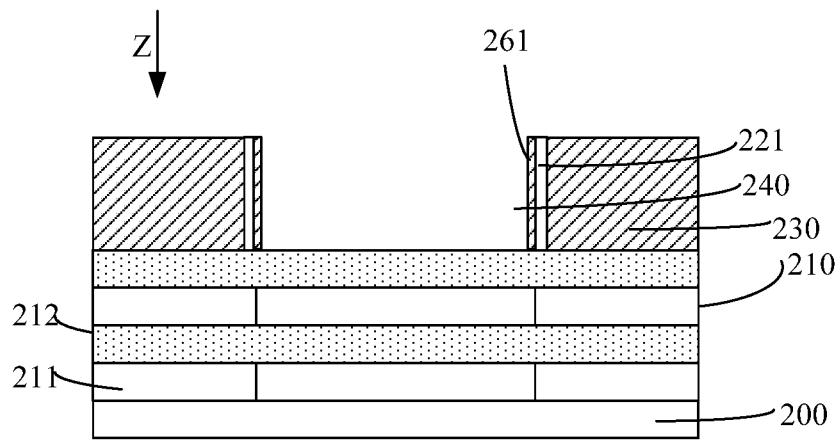

In particular, returning to FIG. 17, after forming the first mask layer, a first sacrificial layer may be formed (S105). FIGS. 9-10 illustrate a corresponding structure. FIG. 9 is a top view of the structure in FIG. 10; and FIG. 10 illustrates a D-D1-sectional view of the structure in FIG. 9.

As shown in FIGS. 9-10, a first sacrificial layer 261 may be formed on the sidewall surfaces of the first opening 240 in the first region A.

In one embodiment, the sidewall structure 221 may be formed on the two sidewall surfaces of the dummy gate structure 220. Thus, the process for forming the first sacrificial layer 261 may include forming a first sacrificial film (not shown) on sidewall surfaces and a bottom surface of the first opening 240 in the first region A. The first sacrificial film may cover the sidewall surfaces of the sidewall structure 221 and portions of the sidewall surfaces and the top surface of the first initial fin structure 210 in the first opening 240 in the first region A. Then, the first sacrificial film may be etched back until the top surface of the first initial fin structure 210 in the first opening 240 in the first region A is exposed to form the first sacrificial layer 261.

Various processes may be used to form the first sacrificial film, such as a chemical vapor deposition process, a physical vapor deposition process, or a thermal oxidation process, etc.

The first sacrificial film may be made of any appropriate material, such as silicon oxide, silicon nitride, or silicon oxynitride, etc. In one embodiment, the first sacrificial film is made of silicon oxide. Correspondingly, the first sacrificial layer 261 may also be made of silicon oxide.

In one embodiment, the first sacrificial film is formed by a thermal oxidation process. The thermal oxidation process may facilitate to form the first sacrificial film inside the first opening 240. In some embodiments, the first sacrificial layer may be formed by a chemical vapor deposition process, or a physical vapor deposition process, etc.

Figure 11:
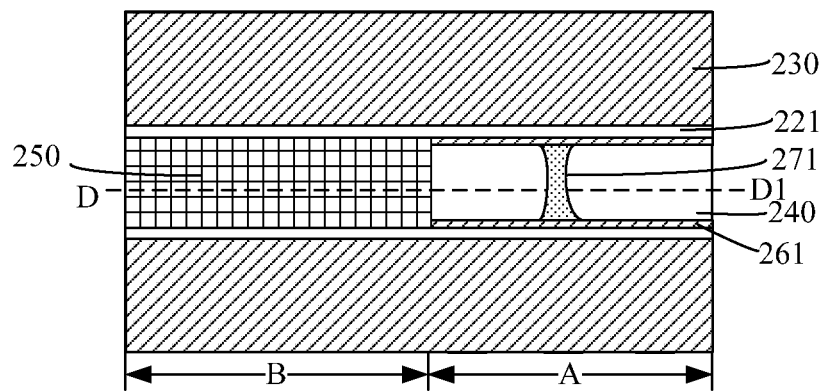
Figure 12:
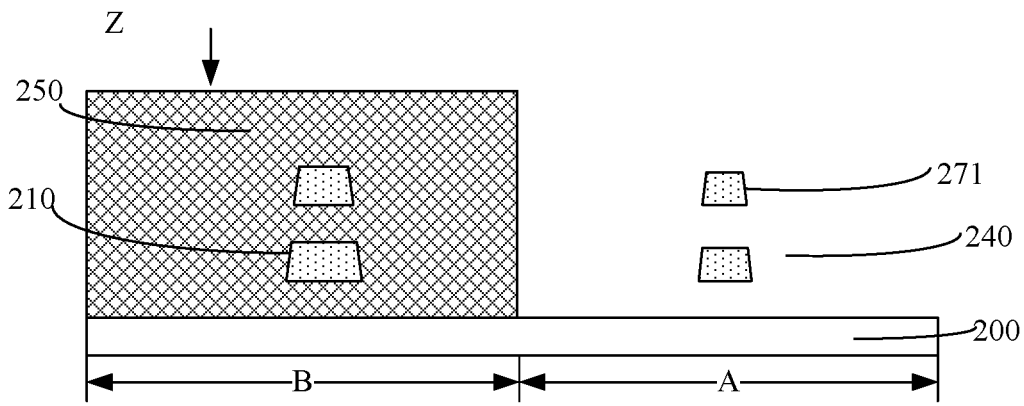

Returning to FIG. 17, after forming the first sacrificial layer, an initial first fin structure may be formed (S106). FIGS. 11-12 illustrate a corresponding structure. FIG. 11 is a top view of the structure in FIG. 12 along the Z direction; and FIG. 12 is a D-D1-sectional view of the structure in FIG. 11.

As shown in FIGS. 11-12, an initial first fin structure 271 is formed by etching portions of the top surface and sidewall surfaces of the first initial fin structure 210 in the first opening 240 in the first region A using the first sacrificial layer 261 and the dielectric layer 230 as an etching mask.

In one embodiment, the initial first fin structure 271 may be formed by etching the portions of the top surface and sidewall surfaces of the first initial fin structure 210 in the first opening 240 in the first region A using the first mask layer 250, the sidewall structure 221, the first sacrificial layer 261 on the sidewall surfaces of the sidewall structure 221, and the dielectric layer 230 as an etching mask.

The process for etching the portion of the top surface and the sidewall surfaces of the first initial fin structure 210 in the first opening 240 in the first region A may include one or a combination of a wet etching process and a dry etching process, etc.

In one embodiment, the process for etching the portion of the top surface and the sidewall surfaces of the first initial fin structure 210 in the first opening 240 in the first region A is a dry etching process. The process parameters of the dry etching process may include a following combination.

The etching gases may include HBr, $O_2$, $Cl_2$, $CH_4$, and $CF_4$, etc. The flow rate of HBr may be in range of approximately 10 sccm-500 sccm. The flow rate of $O_2$ may be in a range of approximately 0-100 sccm. The flow rate of $Cl_2$ may be in a range of approximately 0-500 sccm. The flow rate of $CH_4$ may be in a range of approximately 0-100 sccm. The flow rate of $CF_4$ may be in a range of approximately 0-100 sccm. The pressure may be in a range of approximately 5 mTorr-200 mTorr. The voltage of the source power may be in a range of approximately 100 volts-1500 volts. The bias voltage may be in range of approximately 0-1000 volts. The etching time may be in a range of approximately 10 seconds-600 seconds.

Figure 13:
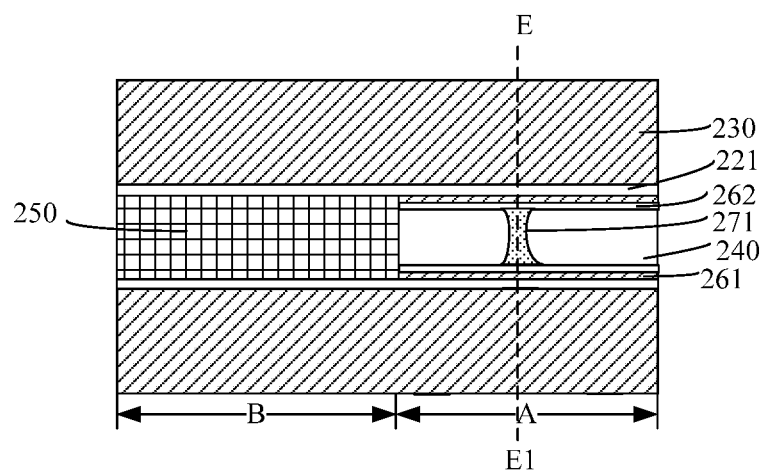
Figure 14:
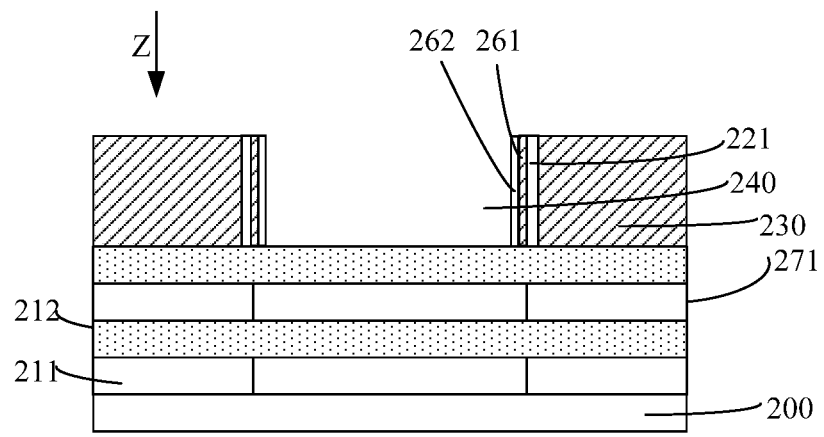

Returning to FIG. 17, after forming the initial first fin structure, a second sacrificial layer may be formed (S107). FIGS. 13-14 illustrate a corresponding semiconductor structure. FIG. 13 is a top view of the structure in FIG. 14 along the Z direction; and FIG. 14 is an E-E1-sectional view of the structure in FIG. 13.

As shown in FIGS. 13-14, a second sacrificial layer 262 may be formed on the sidewall surfaces of the first sacrificial layer in the first opening 240 in the first region A.

The method for forming the second sacrificial layer 262 may include forming a second sacrificial film on the sidewall surfaces of the first sacrificial layer 261. The second sacrificial film may cover portions of the top and sidewall surfaces of the two ends of the initial first fin structure 271 in the first opening 240 in the first region A. Then, the second sacrificial film may be etched back until the initial first fin structure 271 in the first opening 240 in the first region A is exposed to form the second sacrificial layer 262.

The second sacrificial layer 262 and the first sacrificial layer 261 may be made a same material, or different materials.

In one embodiment, the second sacrificial layer 262 and the first sacrificial layer 261 are made of a same material, and the second sacrificial layer 262 is made silicon oxide, which may facilitate the subsequent removal of the first sacrificial layer 261 when subsequently forming a second opening. Accordingly, the fabrication process may be simplified; and the production cost may be saved.

Figure 15:
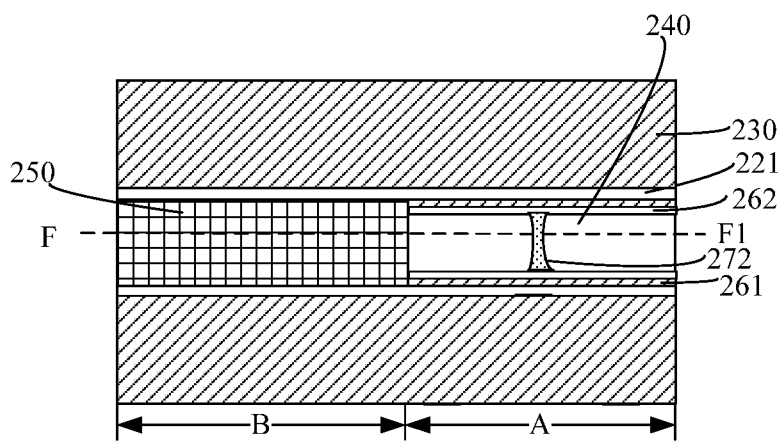

Returning to FIG. 17, after forming the second sacrificial layer, a first fin structure may be formed (S108). FIGS. 15-16 illustrate a corresponding structure. FIG. 15 is a top view of the structure in FIG. 16 along the Z direction; and FIG. 16 is an F-F1-sectional view of the structure in FIG. 15.

As shown in FIGS. 15-16, a first fin structure 272 may be formed. The first fin structure 272 may be formed by etching portions of the top surface and the sidewall surfaces of the initial first fin structure 271 in the first opening 240 in the first region A using the first sacrificial layer 261, the second sacrificial layer 262 on the sidewall surfaces of the first sacrificial layer 261 and the dielectric layer 230 as an etching mask.

In one embodiment, the first fin structure 272 may be formed by etching portions of the top surface and the sidewall surfaces of the initial first fin structure 271 in the first opening 240 in the first region A using the mask layer 250, the sidewall structure 221, the first sacrificial layer 261 on the sidewall surfaces of the sidewall structure 221, the second sacrificial layer 262 on the sidewall surfaces of the first sacrificial layer 261 and the dielectric layer 230 as an etching mask.

The process for etching the portions of the top surface and the sidewall surfaces of the initial first fin structure 271 in the first opening 240 in the first region A may include one or a combination of a wet etching process and a dry etching process, etc.

In one embodiment, the process for etching the portions of the top surface and the sidewall surfaces of the initial first fin structure 271 in the first opening 240 in the first region A may be the similar as the process for etching the portions of the top surface and the sidewall surfaces of the first initial fin structure 210 in the first opening 240 in the first region A.

The width of the first fin structure 272 may be in a range of approximately 2 nm to 10 nm. If the width of the first fin structure 272 is less than approximately 2 nm, the first fin structure 272 with such a small width may be easily broken; and the performance of the formed semiconductor structure may be not as desired. If the width of the first fin structure 272 is greater than approximately 10 nm, the width of the first fin structure 272 may not be significantly reduced; and the width of the first fin structure 272 and the width of the first initial fin structure 210 may not be much different. Thus, the purpose of different performance requirements may still not be satisfied; and the performance of the formed semiconductor structure may still not be as desired.

The thickness of the first fin structure 272 may be in a range of approximately 5 nm to 50 nm. If the thickness of the first fin structure 272 is less than approximately 5 nm, the formed semiconductor structure may have a large leakage current; and the performance of the formed semiconductor structure may not be as desired. If the thickness of the first fin structure 272 is greater than approximately 50 nm, it may be difficult to form a gate structure in the second opening, and it may be easy to generate holes in the formed gate structure. Accordingly, the resistance of the semiconductor structure may be unstable; and the threshold voltage of the semiconductor structure may be unstable. Thus, the yield of the semiconductor structure may be low.

Because a portion of the first fin structure 272 exposed by the first opening 240 may be formed by performing the trimming process (the etching process), the portion of the first fin structure 272 exposed by the first opening 240 may have a width smaller than the width of the portion of the fin structure 272 that is not exposed by the first opening 240. The portion of the first fin structure 272 that is exposed by the first opening 240 and the portion of the first fin structure 272 that is not exposed by the first opening 240 may be connected. Thus, the portion of the first fin structure 272 that is not exposed by the first opening 240 may be able to support the portion of the first fin structure 272 that is exposed by the first opening 240. Accordingly, the possible deformation and/or even the cracking of the first fin structure 272 may be reduced; and the performance of the formed semiconductor structure may be improved.

In one embodiment, the width of the first fin structure 272 formed in the first opening 240 in the first region A may be gradually reduced by the two trimming processes, thus the generation of the leakage current in the semiconductor device may be significantly reduced. Thus, the performance of the formed semiconductor structure may be as desired.

In some embodiments, one trimming processes may be performed. The step for forming the first fin structure by the one trimming process may include forming a first sacrificial layer on the sidewall surfaces of the first opening in the first region. The first sacrificial layer may cover a portion of the top surface of the first initial fin structure in the first opening in the first region. Then, portions of the top surface and sidewall surfaces of the first initial fin structure in the first opening in the first region may be etched using the first mask layer, the first sacrificial layer and the dielectric layer as a mask to form the first fin structure.

Because the second fin structure 213 in the second region B may be covered by the first mask layer 250, the second fin structure 213 may not be affected by the trimming process. In particular, the width of the second fin structure 213 in the second region B may not be reduced. Thus, the semiconductor structure may have the first fin structure 272 and the second fin structure 213 with two different widths. The first fin structure 272 and the second fin structure 213 having different widths may meet different performance requirements; and the semiconductor structure may have a desired performance.

In one embodiment, after the forming the first fin structure 272, the first mask layer 250 in the first opening 240 in the second region B may be removed; and a second opening may be formed in the dielectric layer 230. Further, a gate structure surrounding the first fin structure 272 in the first region A and the second fin structure 213 in the second region B may be formed in the second opening.

In one embodiment, the method for forming the second opening may further include removing the first sacrificial layer 261 on the sidewall surfaces of the sidewall structure 221 and the second sacrificial layer 262 on the sidewall surfaces of the first sacrificial layer 261.

The present disclosure also provides a semiconductor structure. FIGS. 15-16 illustrate an exemplary semiconductor structure consistent with various disclosed embodiments of the present disclosure.

As shown in FIGS. 15-16, the semiconductor structure includes a semiconductor substrate 200. The semiconductor substrate 200 may include a first region A; and a plurality of first fin structures 272 may be formed on the surface of the first region A of the semiconductor substrate 200. The semiconductor structure may also include a dielectric layer 230 formed on the surface of the semiconductor substrate 200; and a first opening 240 may be formed in the dielectric layer 230. The first opening 240 may expose top surfaces and sidewall surfaces of the plurality of first fin structures 272 in the first region A.

The details of the semiconductor structure will be described below with reference to the accompanying drawing.

The semiconductor substrate 200 may also include a second region B adjacent to the first region A. A plurality of second fin structures 213 may be formed on the surface of the second region B of the semiconductor substrate 200. The first opening 240 may also expose the top surfaces and sidewall surfaces of the second fin structures 213 in the second region B.

The width of a portion the first fin structure 272 may be smaller than the width of the second fin structure 213. The thickness of the portion of the first fin structure 272 may be smaller than the thickness of the second fin structure 213.

The width of the first fin structure 272 may be in a range of approximately 2 nm to 10 nm. The thickness of the first fin structure 272 may be in a range of approximately 5 nm to 50 nm.

The type of the device formed in the second region B may be the same as or different from the type of the device formed in the first region A. In one embodiment, the type of the device formed in the second region B is different from the type of the semiconductor device formed in the first region A. The detailed structures and intermediate structures are described above with respect to the fabrication processes The technical solutions of the present disclosure may have at least the following beneficial effects.

In the disclosed method for forming a semiconductor structure, a first opening may be formed in the dielectric layer by removing a dummy gate structure. At least one trimming process may be performed on the top and sidewall surfaces of the first initial fin structures exposed by the first opening in the first region to form first fin structures. The width of the first fin structures may be smaller than the width of the first initial fin structures. Because the portion of the first fin structures exposed by the first opening may be formed by performing the trimming process, the portion of the first fin structures exposed by the first opening may have the width smaller than the width of the portion of the first fin structures not exposed by the first opening. The portion of the first fin structure exposed by the first opening may be connected to the portion of the first fin structure not exposed by the first opening. Thus, the portion of the first fin structure not exposed by the first opening may be able to support the portion of the first fin structure exposed by the first opening. Thus, the possibility of the deformation of the first fin structures and even the possibility of cracking of the first fin structures may be reduced; and the performance of the semiconductor structure may be as desired.

Further, the width of the first fin structure formed in the first opening in the first region by the two trimming processes may be gradually reduced. Thus, the leakage current of the semiconductor device may be significantly reduced; and the performance of the semiconductor structure may be improved.

Further, the semiconductor substrate may also include a second region adjacent to the first region; and a plurality of second initial fin structures may be formed on the surface of the second region of the semiconductor substrate. Because the second fin structure in the second region may be covered by the first mask layer, the trimming process may not be performed on the second fin structure. In particular, the width of the second fin structure in the second region may not be reduced. Thus, the semiconductor structure may have the first fin structure and the second fin structure with two different widths. The first fin structures and the second fin structures having different widths may meet different performance requirements; and the performance of the semiconductor structure may be as desired.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a semiconductor substrate having a first region;
   forming a plurality of first initial fin structures on the first region of the semiconductor substrate;
   forming a dummy gate structure across the plurality of first initial fin structures by covering portions of top and sidewall surfaces of the plurality of first initial fin structures;
   forming a dielectric layer covering sidewall surfaces of the dummy gate structure and exposing a top surface of the dummy gate structure on the semiconductor substrate;
   removing the dummy gate structure and a portion of the plurality of first initial fin structures to form a first opening in the dielectric layer and to expose portions of top, bottom, and sidewall surfaces of the plurality of first initial fin structures; and
   performing at least one trimming process on portions of the plurality of first initial fin structures exposed by the first opening to form a plurality of first fin structures, wherein a width of each of the plurality of first fin structures is smaller than a width of each of the plurality of first initial fin structures.

2. The method according to claim 1, wherein:
   a thickness of each of the plurality of first fin structures is smaller than a thickness of each of the plurality of first initial fin structures.

3. The method according to claim 1, wherein:
   the semiconductor substrate further includes a second region;
   a plurality of second fin structures are formed on the second region of the semiconductor substrate;
   the dummy gate structure is further extended to the second region of the semiconductor substrate and covers portions of top and sidewall surfaces of the plurality of second fin structures;
   the dielectric layer is further formed on the second region of the semiconductor substrate;
   the dielectric layer is formed on sidewall surfaces of the dummy gate structure in the second region and exposes a top surface of the dummy gate structure in the second region; and
   the first opening further exposes portions of top and sidewall surfaces of the plurality of second fin structures after removing the dummy gate structure.

4. The method according to claim 3, after forming the first opening and before forming the plurality of first fin structures, further comprising:
   forming a first mask layer in the first opening in the first region and on the top and sidewall surfaces of the plurality of second fin structures,
   wherein the plurality of first fin structures are formed by performing at least one trimming process on top and sidewall surfaces of the plurality of first inital fin structures in the first opening in the first region.

5. The method according to claim 4, wherein performing the at least one trimming process includes performing one trimming process, wherein the one trimming process for forming the plurality of first fin structures comprises:
   forming a first sacrificial layer on sidewall surfaces of the first opening to cover portions of top and sidewall surfaces of the plurality of first initial fin structures in the first opening in the first region; and
   etching portions of top and sidewall surfaces of the plurality of first initial fin structures in the first opening in the first region using the first mask layer, the first sacrificial layer and the dielectric layer as an etching mask to form the plurality of first fin structures.

6. The method according to claim 4, wherein:
performing the at least one trimming process includes performing two trimming processes for forming the plurality of first fin structures;
the two trimming processes include a first trimming process and a second trimming process; and
the second trimming process is performed after the first trimming process,
wherein the first trimming process includes:
forming a first sacrificial layer on sidewall surfaces of the first opening; and
etching portions of top and sidewall surfaces of the plurality of first initial fin structure in the first opening in the second region using the first mask layer, the first sacrificial layer and the dielectric layer as an etching mask to form a plurality of initial first fin structures; and
the second trimming process includes:
forming a second sacrificial layer on sidewall surfaces of the first sacrificial layer in the first opening in the first region; and
etching portions of top and sidewall surfaces of the plurality of initial first fin structures in the first opening in the first region using the first mask layer, the first sacrificial layer, the second sacrificial layer on the sidewall surfaces of the first sacrificial layer and the dielectric layer as an etching mask to form the plurality of first fin structures.

7. The method according to claim 4, after forming the plurality of first fin structures, further comprising:
removing the first mask layer in the first opening in the second region to form a second opening in the dielectric layer; and
forming a gate structure across the plurality of first fin structures in the first region and the plurality of second fin structures in the second region in the second opening.

8. The method according to claim 1, wherein:
a sidewall structure is formed on two sidewall surfaces of the dummy gate structure.

9. The method according to claim 1, wherein:
each of the plurality of first initial fin structures includes a plurality of layers of composite initial fin layers stacked along a normal direction of a surface of the semiconductor substrate;
the plurality of initial fin layers include a first initial fin layer and a second initial fin layer on the first initial fin layer; and
the first initial fin layer and the second initial fin layer are made of different materials.

10. The method according to claim 9, wherein forming the first opening comprises:
removing the dummy gate structure to form an initial opening in the dielectric layer; and
removing a portion of the first initial fin layer exposed by the sidewall surfaces of the initial opening,
wherein the first opening exposes the suspended second initial fin layer.

11. The method according to claim 1, wherein:
a width of each of the plurality of first fin structures is in a range of approximately 2 nm-10 nm.

12. The method according to claim 1, wherein:
a thickness of each of the plurality of first fin structures is in a range of approximately 5 nm-50 nm.

13. A method for fabricating a semiconductor structure, comprising:
providing a semiconductor substrate having a first region;
forming a plurality of first initial fin structures on the first region of the semiconductor substrate;
forming a dummy gate structure across the plurality of first initial fin structures by covering portions of top and sidewall surfaces of the plurality of first initial fin structures;
forming a dielectric layer covering sidewall surfaces of the dummy gate structure and exposing a top surface of the dummy gate structure on the semiconductor substrate;
removing the dummy gate structure to form a first opening in the dielectric layer and to expose portions of top and sidewall surfaces of the plurality of first initial fin structures; and
performing at least one trimming process on portions of the plurality of first initial fin structures exposed by the first opening to form a plurality of first fin structures, wherein a width of each of the plurality of first fin structures is smaller than a width of each of the plurality of first initial fin structures, wherein the at least one trimming process includes:
forming a sacrificial layer on sidewall surfaces of the first opening in the first region to cover portions of top and sidewall surfaces of the plurality of first initial fin structure in the first opening in the first region; and
etching portions of the top and sidewall surfaces of the plurality of first initial fin structures in the first opening in the first region using the sacrificial layer and the dielectric layer as an etching mask to form the plurality of first fin structures.

14. The method acccording to claim 13, wherein:
a dry etching process is used to etch the portions of the top and sidewall surfaces of the plurality of first initial fin structures in the first opening in the first region;
etching gases of the dry etching process include HBr, $O_2$, $Cl_2$, $CH_4$ and $CF_4$;
a flow rate of HBr is in a range of approximately 10 sccm-500 sccm;
a flow rate of $O_2$ is in a range of approximately 0-100 sccm;
a flow rate of $Cl_2$ is in a range of approximately 0-500 sccm;
a flow rate of $CH_4$ is in range of approximately 0-100 sccm;
a flow rate of $CF_4$ is in a range of approximately 0-100 sccm;
a pressure of the dry etching process is in a range of approximately 5 mTorr-200 mTorr,
a source of voltage of the dry etching process is in a range of approximately 100 V-1500 V;
a bias voltage of the dry etching process is in a range of approximately 0-1000 V; and
a time duration of the dry etching process is in a range of approximately 10 s-600 s.

15. The method according to claim 13, wherein forming the sacrificial layer comprises:
forming a sacrificial film on sidewall surfaces and a bottom surface of the first opening in the first region and on top and sidewall surfaces of the plurality of first initial fin structures in the first opening in the first region; and
etching back the sacrificial film under the top surfaces of the plurality of first inital fin structures in the first opening in the first region are exposed to form the sacrificial layer.

16. A semiconductor structure, comprising:

a semiconductor substrate having a first region;

a plurality of first fin structures formed on the first region of the semiconductor substrate; and a dielectric layer having a first opening formed on the semiconductor substrate, wherein the first opening exposes top, bottom, and sidewall surfaces of the plurality first fin structures in the first region, wherein the plurality of first fin structures are formed by:

forming a plurality of first initial fin structures on the first region of the semiconductor substrate;

forming a dummy gate structure across the plurality of first initial fin structures by covering portions of top and sidewall surfaces of the plurality of first initial fin structures;

forming the dielectric layer covering sidewall surfaces of the dummy gate structure and exposing a top surface of the dummy gate structure on the semiconductor substrate;

removing the dummy gate structure and a portion of the plurality of first initial fin structures to form the first opening in the dielectric layer and expose portions of top, bottom, and sidewall surfaces of the plurality of first initial fin structures; and performing at least one trimming process on portions of the plurality of first initial fin structures exposed by the first opening to form the plurality of fin first structures, wherein a width of each of the plurality of first fin structures is smaller than a width of each of the plurality of first initial fin structures.

17. The semiconductor structure according to claim 16, further comprising:

a second region surrounding the first region, wherein:

a plurality of second fin structures are formed on the second region of the semiconductor substrate; and the first opening also exposes top and sidewall surfaces of the plurality of second fin structures.

18. The semiconductor structure according to claim 17, wherein:

a width of a portion of each of the plurality of first fin structures is smaller than a width of a portion of each of the plurality of second fin structures; and a thickness of the portion of each of the plurality of first fin structures is smaller than a width of the portion of each of the plurality of second fin structures.

19. The semiconductor structure according to claim 16, wherein:

a width of each of the plurality of first fin structures is in a range of approximately 2 nm-5 nm; and a thickness of each of the plurality of first fin structures is in a range of approximately 5 nm-50 nm.

20. The semiconductor structure according to claim 16, wherein:

each of the plurality of first initial fin structures includes a plurality of layers of composite initial fin layers stacked along a normal direction of a surface of the semiconductor substrate;

the plurality of initial fin layers include a first initial fin layer and a second initial fin layer on a surface of the first initial fin layer; and the first initial fin layer and the second initial fin layer are made of different materials.

* * * * *